United States Patent
Yamada

(10) Patent No.: US 7,774,201 B2
(45) Date of Patent: Aug. 10, 2010

(54) ACOUSTIC DEVICE WITH FIRST AND SECOND GAIN SETTING UNITS

(75) Inventor: Katsushi Yamada, Kanagawa (JP)

(73) Assignee: Panasonic Corporation, Osaka (JP)

( * ) Notice: Subject to any disclaimer, the term of this patent is extended or adjusted under 35 U.S.C. 154(b) by 830 days.

(21) Appl. No.: 11/569,448

(22) PCT Filed: May 23, 2005

(86) PCT No.: PCT/JP2005/009367

§ 371 (c)(1),
(2), (4) Date: Nov. 21, 2006

(87) PCT Pub. No.: WO2005/117254

PCT Pub. Date: Dec. 8, 2005

(65) Prior Publication Data

US 2008/0015851 A1    Jan. 17, 2008

(30) Foreign Application Priority Data

May 31, 2004    (JP) .............................. 2004-160829

(51) Int. Cl.
  *H03G 3/20* (2006.01)
  *G10L 21/00* (2006.01)
(52) U.S. Cl. .................... 704/225; 381/104; 455/232.1; 455/241.1; 455/247.1
(58) Field of Classification Search .................. 704/225; 381/54, 104, 106, 107, 109; 455/232.1, 247.1, 455/241.1; 375/345
  See application file for complete search history.

(56) References Cited

U.S. PATENT DOCUMENTS 3,920,931 A * 11/1975 Yanick, Jr. .................. 381/321
3,947,665 A * 3/1976 Hundley ..................... 700/84
4,506,381 A   3/1985 Ono (Continued)

FOREIGN PATENT DOCUMENTS

GB    2179810 A    3/1987

(Continued)

OTHER PUBLICATIONS

Choy G et al, "Subband-Based Acoustic Shock Limiting Algorithm On A Low-Resource DSP System."

(Continued)

*Primary Examiner*—Martin Lerner
(74) *Attorney, Agent, or Firm*—Pearne & Gordon LLP

(57) ABSTRACT

A purpose of the present invention is to provide an acoustic apparatus capable of automatically setting a gain which is suitable for both an averaged signal strength of input voice and an instantaneous signal strength thereof, capable of easily recognizing an effect by a user, which is achieved by switching a turn-ON and a turn-OFF of an automatic gain variable operation, and further capable of readily recognizing a change in gain values by the user. The acoustic apparatus is provided with a gain setting unit (20) for setting a gain from an averaged voice strength within a predetermined time period, and another gain setting unit (22) for setting a gain in response to an instantaneous signal strength thereof; and the acoustic apparatus adjusts a signal strength of an audio input signals (Si) based upon a gain "C" obtained by multiplying a gain "A" by another gain "B."

7 Claims, 6 Drawing Sheets

U.S. PATENT DOCUMENTS

| | | | | |
|---|---|---|---|---|
| 4,538,300 A | * | 8/1985 | Richards, Jr. | 455/161.1 |
| 4,926,139 A | * | 5/1990 | Anderson et al. | 330/294 |
| 5,303,308 A | * | 4/1994 | Larsen et al. | 381/106 |
| 5,369,711 A | | 11/1994 | Williamson, III | |
| 5,428,687 A | * | 6/1995 | Willcocks et al. | 381/18 |
| 5,796,847 A | * | 8/1998 | Kaihotsu et al. | 381/57 |
| 6,049,361 A | * | 4/2000 | Kim | 348/678 |
| 6,050,649 A | * | 4/2000 | Hensley | 303/7 |
| 6,088,583 A | * | 7/2000 | Shimizu et al. | 455/235.1 |
| 6,317,709 B1 | * | 11/2001 | Zack | 704/225 |
| 6,535,846 B1 | * | 3/2003 | Shashoua | 704/225 |
| 6,920,223 B1 | * | 7/2005 | Fosgate | 381/22 |
| 7,013,381 B2 | * | 3/2006 | Yamada | 712/35 |
| 7,254,194 B2 | * | 8/2007 | Lin et al. | 375/345 |
| 7,327,294 B2 | * | 2/2008 | Gierenz et al. | 341/139 |
| 2001/0053680 A1 | * | 12/2001 | Yamanaka et al. | 455/232.1 |

FOREIGN PATENT DOCUMENTS

| | | |
|---|---|---|
| JP | 07-312530 A | 11/1995 |
| JP | 11-75286 | 3/1999 |
| JP | 2000-78685 | 3/2000 |
| JP | 2002-299975 A | 10/2002 |
| JP | 2004-20733 | 1/2004 |

OTHER PUBLICATIONS

European Search Report dated Feb. 11, 2008.
Choy G et al, "Subband-Based Acoustic Shock Limiting Algorithm On A Low-Resource DSP System," Eurospeech 2003, pp. 2869 to 2872.

* cited by examiner

PRIOR ART

ACOUSTIC DEVICE WITH FIRST AND SECOND GAIN SETTING UNITS

TECHNICAL FIELD

The present invention is related to an acoustic apparatus equipped with an automatic gain variable device which automatically sets a proper amplification degree in response to a signal strength of an audio input signal derived from a microphone, and the like, while the acoustic apparatus is employed in, for instance, an audio appliance.

BACKGROUND ART

Conventionally, automatic gain variable devices of the above-explained acoustic apparatus have been developed (refer to, for instance, patent literature 1). FIG. 9 is a block diagram for indicating the arrangement of the automatic gain variable device of the conventional acoustic apparatus disclosed in the above-explained patent literature 1.

The conventional automatic gain variable device 90 shown in FIG. 9 is arranged by a signal amplifying unit 91, a signal strength detecting unit 92, a signal strength holding unit 93, and a signal gain setting unit 94. The signal amplifying unit 91 amplifies an input signal "Si" based upon a gain set by the signal gain setting unit 94, and then, outputs the amplified input signal "Si" as an output signal "So." The signal strength detecting unit 92 detects a signal strength of the input signal "Si" for a predetermined time period. The signal strength holding unit 93 holds a maximum signal strength detection result detected by the signal strength detecting unit 92. The signal gain setting unit 94 sets a constant gain to the signal amplifying unit 91, while the constant gain corresponds to the maximum signal strength held by the signal strength holding unit 93.

In such an arrangement, the signal strength is amplified and adjusted based upon a low gain with respect to a large audio input signal, whereas the signal strength is amplified and adjusted based upon a high gain with respect to a small audio input signal.

Patent Literature 1: JP-A-11-75286

DISCLOSURE OF THE INVENTION

Problems that the Invention is to Solve

However, the conventional acoustic apparatus sets the gain based upon the result obtained by detecting the input signal strength within one predetermined time period. As a result, there is such a problem that the conventional acoustic apparatus cannot set such a gain which is suitable to both the averaged signal strength and the simultaneous signal strength with respect to the audio input signal, but the following characteristic of the gain adjustment with respect to the audio input signal becomes unnatural.

The present invention has been made to solve the above-described problem, and therefore, has an object to provide an acoustic apparatus capable of automatically setting a gain which is suitable to both an averaged signal strength of an audio input signal and an instantaneous signal strength of the audio input signal.

Means for Solving the Problems

The above-described object is achieved by the below-mentioned arrangement and method.

An acoustic apparatus of the present invention is featured by such an acoustic apparatus for automatically setting a proper amplification degree in response to a signal strength of an audio input signal, comprising: a first gain setting unit that sets a gain in response to an averaged signal strength of an audio input signal within a predetermined time period; a first signal amplifying unit that adjusts a signal strength of the audio input signal based upon the gain set by the first gain setting unit; a second gain setting unit sets a gain in response to an instantaneous signal strength of an audio output signal of the first signal amplifying unit; a gain calculating unit that synthesizes the gain set by the first gain setting unit with the gain set by the second gain setting unit; and a second signal amplifying unit that adjusts the signal strength of the audio input signal based upon the gain calculated by the gain calculating unit.

The acoustic apparatus of the present invention is featured by comprising: a switch unit that sets a turn-ON and a turn-OFF of an automatic gain variable operation; and a control unit sets to the gain calculating unit, such a gain which gives no change to the signal strengths in an input and an output of the second signal amplifying unit in the case that the switch unit is set to the OFF state.

The acoustic apparatus of the present invention is featured by comprising: a display unit that visualizes the gain calculated by the gain calculating unit.

An automatic gain variable method of the present invention is featured by such an automatic gain variable method for automatically setting a proper amplification degree in response to a signal strength of an audio input signal, comprising: a first gain setting step of setting a gain in response to an averaged signal strength of an audio input signal within a predetermined time period; a first signal amplifying step of adjusting a signal strength of the audio input signal based upon the gain set by the first gain setting step; a second gain setting step of setting a gain in response to an instantaneous signal strength of an audio output signal of the first signal amplifying step; a gain calculating step of synthesizing the gain set by the first gain setting step with the gain set by the second gain setting step; and a second signal amplifying step of adjusting the signal strength of the audio input signal based upon the gain calculated by the gain calculating step.

ADVANTAGE OF THE INVENTION

The acoustic apparatus of the present invention sets the gain of the second signal amplifying unit by synthesizing the gain in response to the averaged signal strength by the first gain setting means with the gain in response to the instantaneous signal strength by the second gain setting means. As a result, the following characteristic of the gain adjustment with respect to the audio input signal is improved, and the gain variable control can be carried out without having a sense of incongruity.

Figure 1:
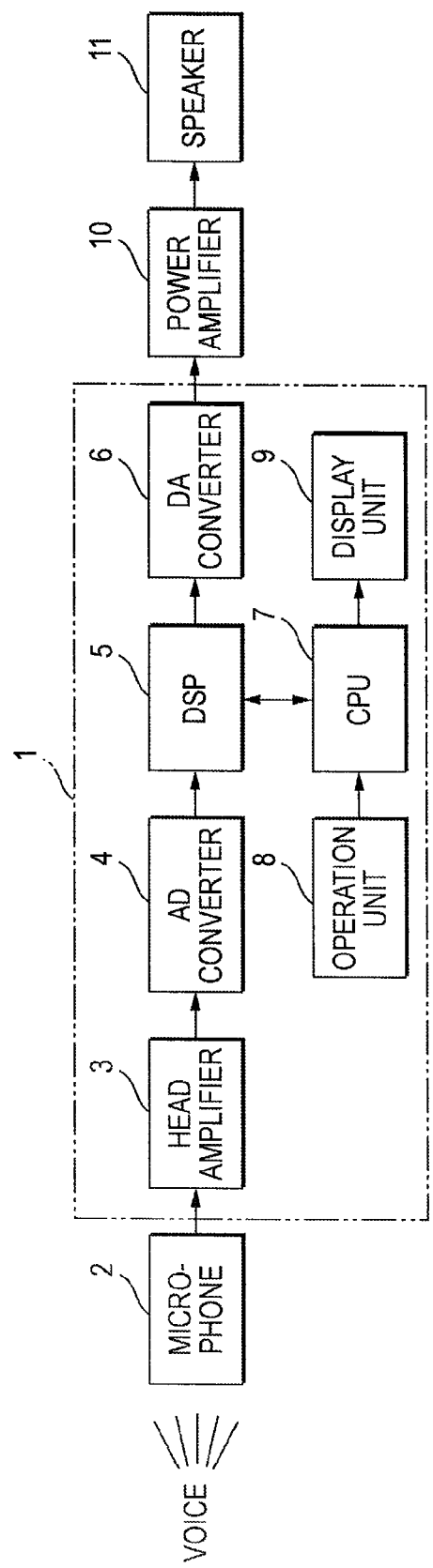
FIG. 1 is a block diagram for representing an arrangement of a digital audio appliance into which an automatic gain variable device according to an embodiment mode of the present invention is assembled.

DESCRIPTION OF REFERENCE NUMERALS AND SIGNS 1 digital audio appliance
2 microphone
3 head amplifier
4 AD converter
5 DSP
6 DA converter
7 CPU
8 operation unit
9 display unit
10 power amplifier
11 speaker
20, 22 gain setting unit
21, 24 signal amplifying unit
23 gain calculating unit
25 CPU interface
21 ON switch
32 OFF switch
41 meter

BEST MODE FOR CARRYING OUT THE INVENTION

Referring now to drawings, preferred embodiment modes for carrying out the present invention will be described in detail.

FIG. 1 is a block diagram for showing an arrangement of a digital audio appliance corresponding to an acoustic apparatus into which an automatic gain variable device according to an embodiment mode of the present invention has been assembled.

In FIG. 1, a digital audio appliance 1, into which the automatic gain variable device according to the present embodiment mode has been assembled, is equipped with a head amplifier 3, an AD converter 4, a DSP (digital signal processor) 5, a DA converter 6, a CPU 7 for controlling the DSP 5, an operation unit 8, and a display unit (corresponding to a display unit) 9. The head amplifier 3 amplifies an audio very weak input signal from a microphone 2 up to an input level of the AD converter 4. The AD converter 4 converts an audio input signal from the head amplifier 3 into a digital signal. The DSP 5 performs a process operation of the digital input audio signal digitalized by the AD converter 4. The DA converter 6 converts the audio output signal from the DSP 5 into an analog audio signal. The operation unit 8 applies an instruction for controlling the DSP 5 via the CPU 7. The display unit 9 displays a status of the DSP 5 via the CPU 7 to a user. The above-explained DSP 5 realizes the automatic gain variable device according to the present embodiment mode.

An audio very weak signal from the microphone 2, which corresponds to voice inputted to the microphone 2, is amplified based on a gain set by the digital audio appliance 1, and furthermore, the amplified audio signal is furthermore power-amplified by a power amplifier 10, and then, the power-amplified audio signal is outputted as sound from a speaker 11.

Figure 2:
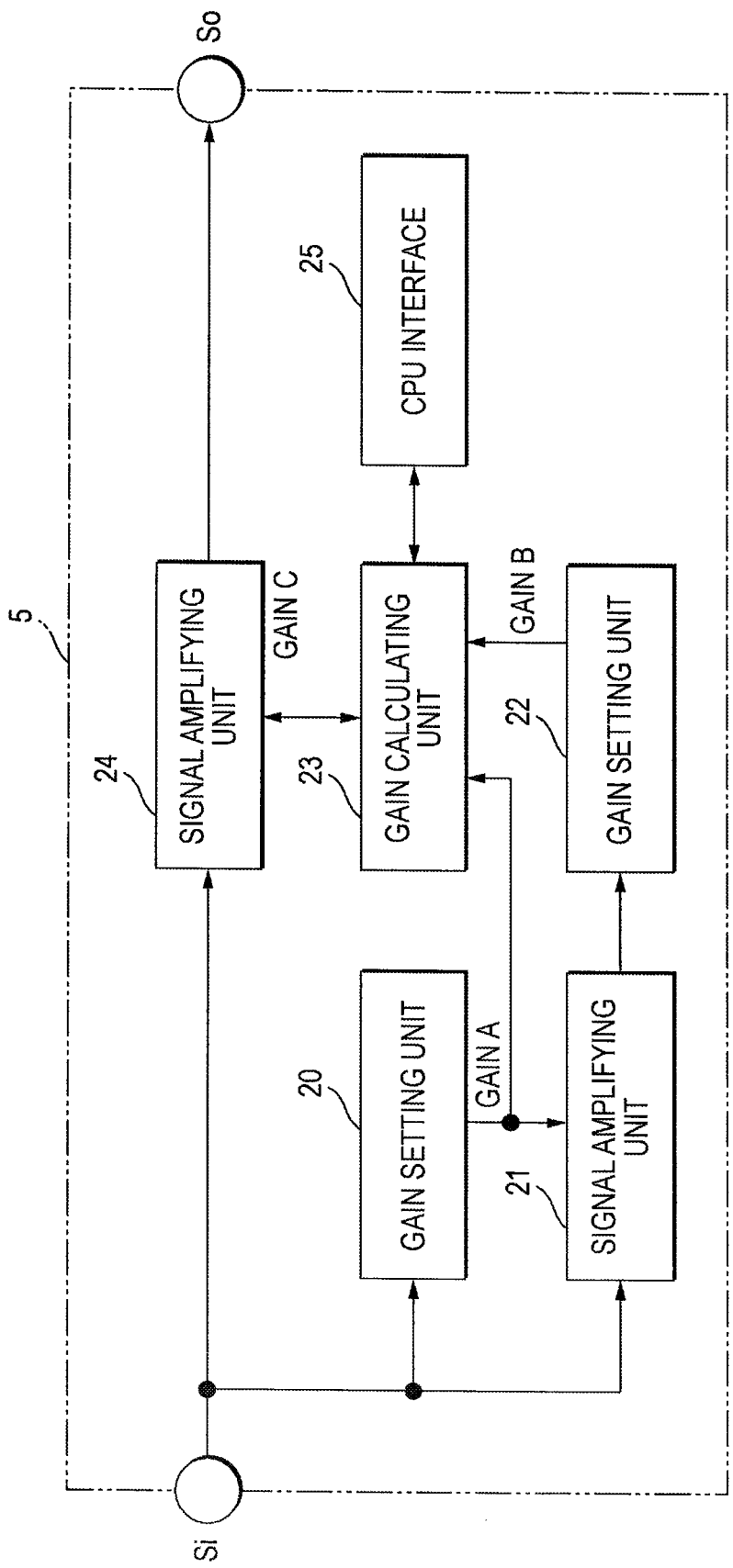
FIG. 2 is a block diagram for showing a function of a DSP which realizes the automatic gain variable device according to the embodiment mode of the present invention.

FIG. 2 is a block diagram for representing a function of the DSP 5 which performs a signal process operation in the automatic gain variable device of the digital audio appliance 1 according to the present embodiment mode. In FIG. 2, the DSP 5 is equipped with a gain setting unit 20, a signal amplifying unit 21, another gain setting unit 22, a gain calculating unit 23, another signal amplifying unit 24, and a CPU interface 25. The gain setting unit 20 sets a gain based upon an averaged signal strength of an audio input signal "Si" within a predetermined time period. The signal amplifying unit 21 adjusts a signal strength of the audio input signal "Si" based on a gain "A" set by the gain setting unit 20. The gain setting unit 22 sets a gain in response to an instantaneous signal strength of an audio output signal of the signal amplifying unit 21. The gain calculating unit 23 multiplies a gain "B" set by the gain setting unit 22 by the gain "A" set by the gain setting unit 20. The signal amplifying unit 24 adjusts the signal strength of the audio input signal "Si" based in a gain "C" set by the gain calculating unit 23. The CPU interface 25 is used to connect the DSP 5 to the CPU 7. The signal amplifying unit 24 outputs the audio input signal "Si" whose signal strength has been adjusted as an audio output signal "So."

It should be noted that the above-described gain setting unit 20 corresponds to a first gain setting unit; the signal amplifying unit 21 corresponds to a first signal amplifying unit; the gain setting unit 22 corresponds to a second gain setting unit; the gain calculating unit 23 corresponds to a gain calculating unit; and the signal amplifying unit 24 corresponds to a second signal amplifying unit.

Figure 3:
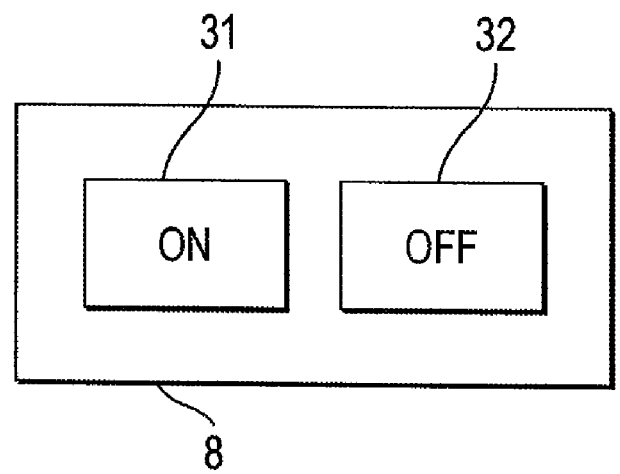
FIG. 3 is a diagram for indicating a switch unit of the digital audio appliance which assembles the automatic gain variable device of FIG. 1.

Returning back to FIG. 1, as represented in FIG. 3, the operation unit 8 is provided with an ON switch (corresponding to a switch unit) 31 and an OFF switch (corresponding to a switch unit) 32. The ON switch 31 turns ON an automatic gain variable operation, whereas the OFF switch 32 turns OFF the automatic gain variable operation. It should also be understood that the automatic gain variable operation may be alternatively turned ON and OFF by employing a single switch.

Figure 4:
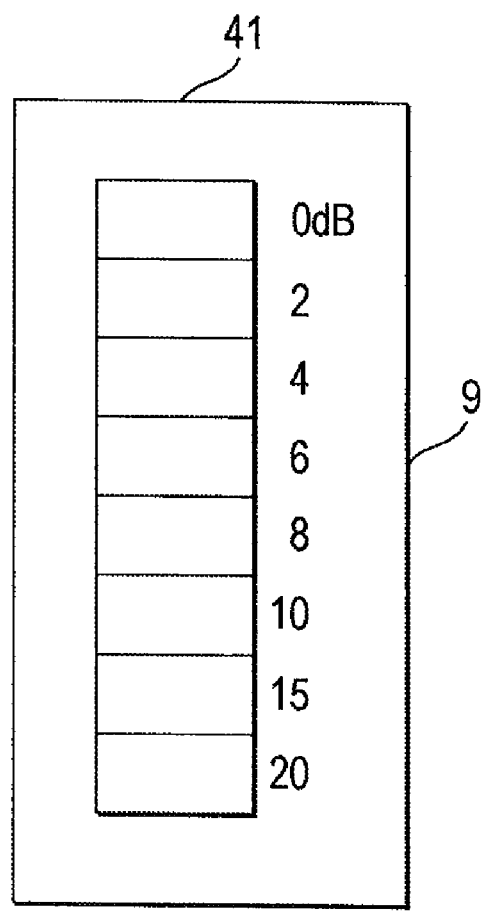
FIG. 4 is a diagram for representing a display unit of the digital audio appliance which has assembled thereinto the automatic gain variable device of FIG. 1.

As indicated in FIG. 4, a meter 41 is provided on the display unit 9, while the meter 41 is constituted by a plurality of LEDs (light emitting diodes) arrayed in a straight line shape. A gain value is relatively displayed by this meter 41. In the present embodiment mode, while "1" is defined as 0 (zero) dB and is equal to such a gain which gives no change to signal strengths of an input and an output, gains are displayed as 8 sorts of resolution, namely, −2, −4, −6, −8, −10, −15, and −20 in the unit of dB. It should also be noted that the above-explained resolution is merely one example, and therefore the present invention is not limited thereto.

Next, a description is made of operations as to the automatic gain variable device according to the present embodiment mode, which is realized by the DSP 5. It is so assumed that the digital audio appliance 1 of the present embodiment mode is operated at a sampling frequency of 48 KHz.

In the case that an automatic gain variable operation is not carried out, the gain of the signal amplifying unit 24 has been fixed to "1" equal to such a gain which gives no change to signal strengths of the input and the output. As previously explained, this gain "1" is expressed as 0 dB. Also, the amplification degree of the power amplifier 10 has been set to such an amplification degree that even when the audio input signal "Si" is small, sound is outputted from the speaker 11 at a sufficiently required strength. In this case, when the audio input signal "Si" is large, sound is outputted from the speaker 11 at an excessive strength, which may give an unpleasant feeling such as sound breaks to a user who is a listener.

Figure 5:
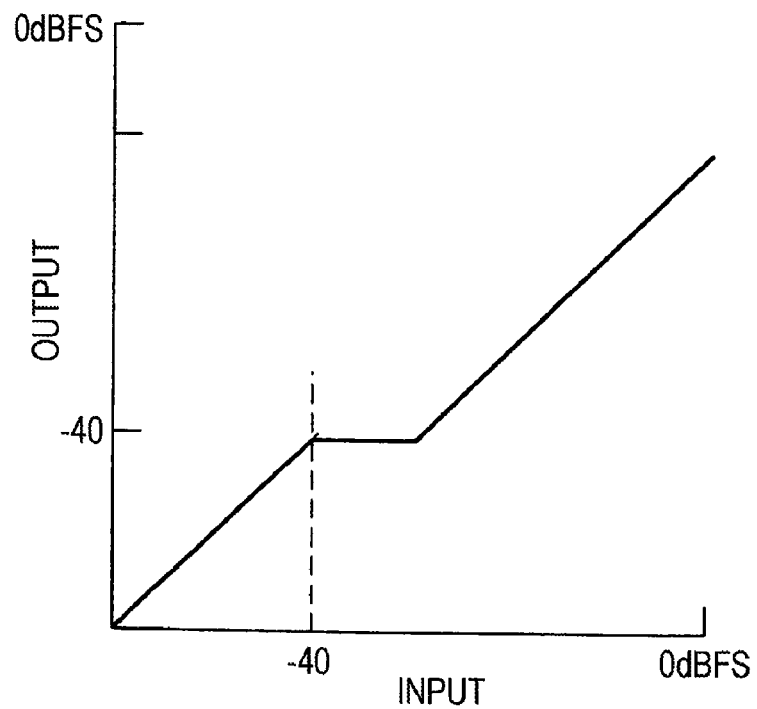
FIG. 5 is a diagram for representing an input/output characteristic in accordance with a gain "A" of the automatic gain variable device of FIG. 1.

When the automatic gain variable operation is carried out, the gain setting unit 20 detects an averaged value of signal strengths of the audio input signals "Si" for every 1 second, namely for every 48,000 sampling periods. In the case that this averaged value is larger than, or equal to −40 dBFS (relative value with respect to digital full scale value of 0 dB is expressed by dBFS), the gain setting unit 20 changes the gain for every −0.5 dB so as to set the gain "A", and continues a gain descent change for every 1 second in such a manner that the set gain value is reached to such a gain value which constitutes an input/output characteristic as shown in FIG. 5. Also, in such a case that an averaged value of signal strengths is smaller than, or equal to −40 dB, the gain setting unit 20 changes the gain for every +1 dB so as to set the gain "A", and continues a gain ascent change for every 1 second in such a manner that the set gain value is reached to such a gain value which constitutes the input/output characteristic as shown in FIG. 5. Then, the signal amplifying unit 21 adjusts the signal strength of the audio input signal "Si" in the gain "A" for every sampling period so as to produce an input signal to the gain setting unit 22.

Figure 6:
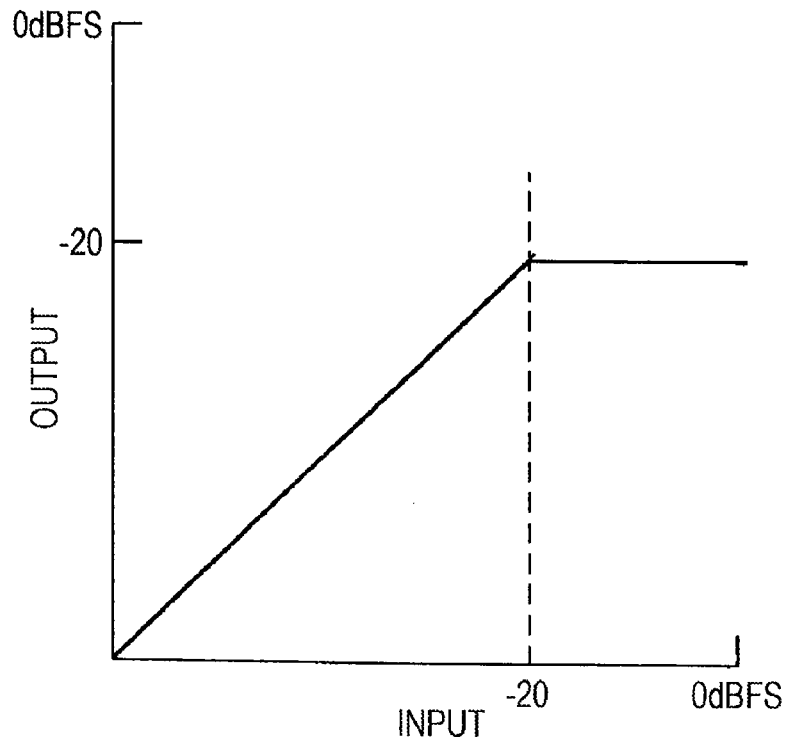
FIG. 6 is a diagram for representing an input/output characteristic in accordance with a gain "B" of the automatic gain variable device of FIG. 1.

The gain setting unit 22 detects an instantaneous value of a signal strength for every sampling period. In the case that this instantaneous value is larger than, or equal to −20 dBFS, the gain setting unit 22 changes the gain so as to set the gain "B", and continues a gain descent change for every sampling period until the set gain is reached to such a gain value which constitutes an input/output characteristic as represented in FIG. 6. It should also be noted that the input/output characteristic shown in FIG. 6 is generally referred to as a "limiter characteristic" in an audio appliance. As to the gain changing manner of the gain setting unit 22, various gain changing manners are known, and the gain "B" is changed in a predetermined time constant. The gain calculating unit 23 multiplies the gain "A" by the gain "B" for every sampling period so as to calculate a gain "C", and then, applies this calculated result to the signal amplifying unit 24. The signal amplifying unit 24 adjusts the signal strength of the audio input signal "Si" based upon the gain "C" so as to output an audio output signal "So."

As a consequence, even when the audio input signal "Si" is small, the sound is outputted from the speaker 11 at the sufficiently necessary strength, whereas when the audio input signal "Si" is large, the amplification gain is automatically lowered, so that the sound is outputted from the speaker 11 at the proper strength.

Also, since the gain is changed based upon the averaged signal strength, it is possible to avoid that the sound is fluctuated which is caused by the gain change which may follow the signal strengths in a high sensitivity. Also, although an instantaneously large input signal is not largely reflected on the averaged signal strength, but is greatly reflected on the instantaneous signal strength, the instantaneously large input signal may follow the excessively large signal strength in the high sensitivity, and the excessively large sound outputted from the speaker 11 can be avoided. Such an unpleasant feeling as sound breaks is not given to the user who is to the listener. It should also be understood that both the gain change amounts and the input/output characteristics as indicated in FIG. 5 and FIG. 6 are merely one example, and therefore, the present invention is not limited thereto.

Next, a description is made of gain variable operations in such a case that the automatic gain variable operation is turned ON and OFF in response to operations by the user.

When the user depresses the OFF switch 32 of the operation unit 8 under such a condition that the automatic gain variable operation is turned ON, the CPU 7 sets "1=(0 dB)" via the CPU interface 25 provided in the DSP 5 to both the gain "A" and the gain "B" of the gain calculating unit 23, while "1(=0 dB)" corresponds to the gain which gives no change to the signal strengths in the input and output. Then, the gain calculating unit 23 calculates a gain "C" in accordance with a formula (1) for every sampling period. It is so defined that an initial value of "Cn−1" is such a gain "Cx" at the last time instant during the ON time, and the subsequent Cn−1 is a calculated value "Cn" before one sampling period.

$$Cn=\{A+\alpha(Cn-1-A)\}XB \qquad \text{formula (1)}$$

Figure 7:
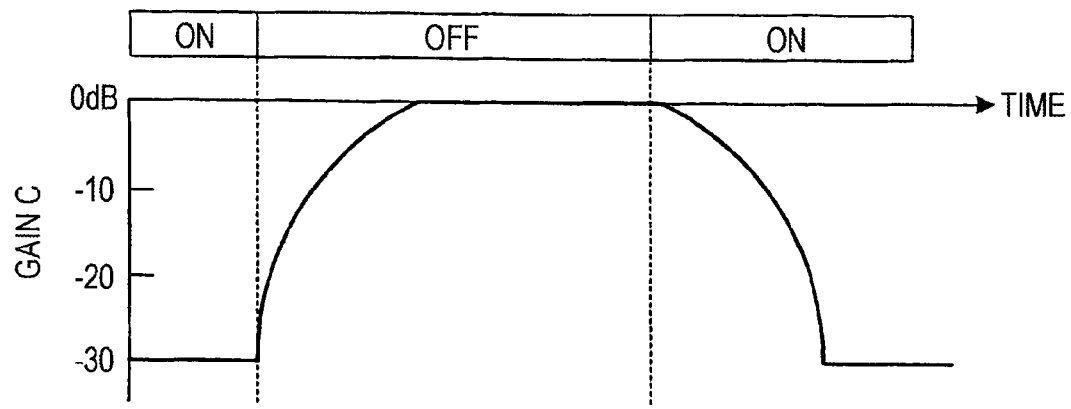
FIG. 7 is a diagram for showing a change in a gain "C" when an automatic gain variable operation of the automatic gain variable device of FIG. 1 is turned ON and OFF.

That is, since symbol "α" is selected to be a time constant smaller than or equal to 1, the gain "C" is smoothly changed from the gain "Cx" at the last time instant during the ON time to "1", and then, is converged to "1." FIG. 7 schematically shows one example as to the change in the gain C. The gain "Cx" is changed within a range from 0 dB to −30 dB.

On the other hand, when the user depresses the ON switch 31 of the operation unit 8 under such a condition that the automatic gain variable operation is turned OFF, the CPU 7 sets both the gain "A" from the gain setting unit 20 and the gain "B" from the gain setting unit 22 to the gain calculating unit 23 via the CPU interface 25 provided in the DSP 5. Then, the gain calculating unit 23 calculates a gain "C" in accordance with the above-described formula (1) for every sampling period. An initial value of "Cn−1" corresponds to the gain C =1(=0dB) during the OFF time, and the gain "C" is smoothly changed from "1=(0dB)" to a multiplied result between the gain A and the gain B. FIG. 7 schematically represents one example as to the change in the gain C.

In other words, since the user operates the OFF switch 32 and the ON switch 31 of the operation unit 8, the user can clearly recognize the automatic gain variable effect during the ON time. Also, the gain during the ON time and the gain during the OFF time are smoothly changed, so that an occurrence of noise when the ON switch 32 and the OFF switch 31 are switched can be suppressed.

Next, an explanation is made of operations for visualizing and displaying the automatic gain variable operation with respect to the user.

Figure 8A:
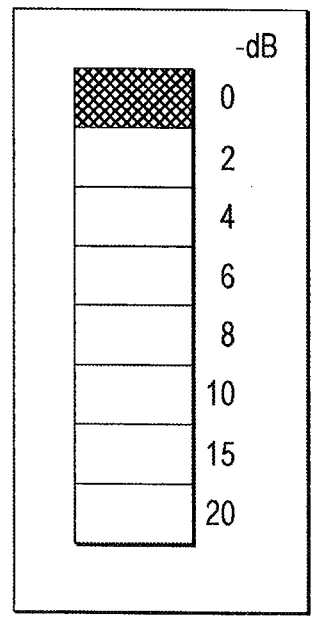
FIG. 8 is a diagram for representing a display example of the display unit of the digital audio appliance which has assembled thereinto the automatic gain variable device of FIG. 1.
Figure 8B:
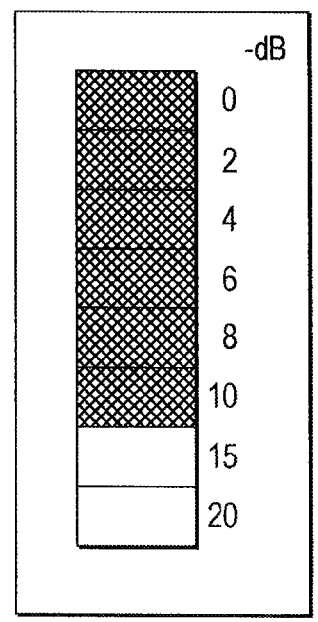
Figure 9:
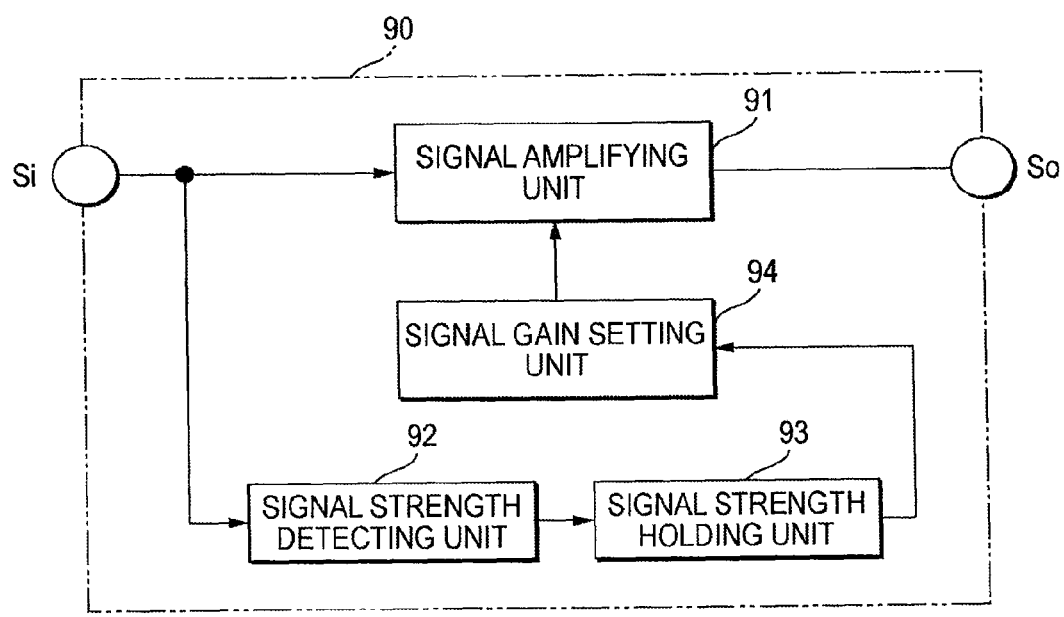
FIG. 9 is a block diagram for representing the arrangement of the conventional automatic gain variable device.

The gain C calculated by the gain calculating unit 23 is supplied via the CPU interface 25 provided in the DSP 5 to the CPU 7. The CPU 7 turns ON the meter 41 of the display unit 9 in a stepwise manner in response to the value of this gain C. For instance, in such a case that the gain is equal to 0 dB which also includes the gain during the OFF time, as shown in FIG. 8(a), a 0 dB portion is turned ON. When the gain is equal to −10 dB, as shown in FIG. 8(b), a 0 dB portion, a −2 dB portion, a −4 dB portion, a −6 dB portion, a −8 dB portion, and a −10 dB portion are turned ON.

In other words, while including both the ON operation and the OFF operation, the gain changes caused by the automatic gain variable operations can be confirmed by the user based upon the indication of the meter 41, and the effects achieved by the automatic gain variable operations can be clearly recognized by the user.

As previously explained, in accordance with the automatic gain variable device of the present embodiment mode, the gain corresponding to the averaged signal strength is multiplied by the gain corresponding to the instantaneous signal strength with respect to the audio input signal "Si" so as to set the gain with respect to the audio input signal "Si." As a result, the following characteristic of the gain adjustment to the audio input signal "Si" may be improved, so that the gain variable control can be carried out without having a sense of incongruity.

Also, while the OFF switch 32 and the ON switch 31 capable of setting ON and OFF operations of the automatic gain variable operation are provided, when the automatic gain variable operation is turned OFF, "1" is set to the gain calculating unit 23, and this value "1" corresponds to such a gain which gives no change to the signal strengths in the input and output of the signal amplifying unit 24. As a result, the automatic gain variable effect when the automatic gain variable operation is turned ON can be clearly recognized by the user. Also, the gains during the ON time and the OFF time are smoothly changed in the gain calculating unit 23, so that the occurrence of the noise when the gain is switched can be suppressed.

Also, since such a meter 41 is provided which visualizes the gain calculated by the gain calculating unit 23, the user can clearly recognize the effects achieved by the automatic gain variable operation.

It should also be noted that in the present embodiment mode, although the gain setting unit 20 detects the averaged audio signal strength of the audio input signal "Si" within the predetermined time period, the gain setting unit 20 may alternatively detect a maximum value within the predetermined time period. Also, the gain setting unit 20 may alternatively calculate the averaged audio signal strength by employing a relative formula between the maximum value and the averaged value. Further, the gain setting unit 20 may alternatively detect both the maximum value and the averaged value in predetermined time periods different from each other.

Also, in the above-explained embodiment mode, the automatic gain variable device provided in the digital audio appliance has been described. Apparently, the present invention may be embodied in an analog audio appliance.

While the present invention has been described in detail, or with reference to the specific embodiment mode, the present invention may be modified and changed in various modes without departing from the technical scope and spirit of the invention, which is apparent to those skilled in the art.

The present patent application has been made based upon Japanese Patent Application (No. 2004-160829) filed on May 31, 2004, the contents of which are incorporated herein as reference.

INDUSTRIAL APPLICABILITY

The present invention can be applied to audio appliances which automatically set proper amplification degrees in response to signal strengths of audio input signals supplied from a microphone, and the like.

The invention claimed is:

1. An acoustic apparatus, comprising:
    a first gain setting unit that sets a gain, A, in response to an averaged signal strength of an audio input signal within a predetermined time period;
    a first signal amplifying unit that adjusts a signal strength of the audio input signal based upon the gain A set by the first gain setting unit;
    a second gain setting unit that sets a gain, B, in response to an instantaneous signal strength of an audio output signal of the first signal amplifying unit;
    a gain calculating unit that calculates a gain, $C_n$, as a product of gain A and gain B adjusted by a smoothing factor including $\alpha C_{n-1}$ B, wherein $\alpha$ is selected to be a time constant smaller than or equal to 1 so that the gain $C_n$ is smoothly changed; and
    a second signal amplifying unit that adjusts the signal strength of the audio input signal based upon the gain $C_n$ calculated by the gain calculating unit.

2. The acoustic apparatus according to claim 1, comprising:
    a switch unit that sets a turn-ON and a turn-OFF of an automatic gain variable operation; and
    a control unit that sets to the gain calculating unit, such a gain which gives no change to the signal strengths in an input and an output of the second signal amplifying unit in the case that the switch unit is set to the OFF state.

3. The acoustic apparatus according to claim 2, wherein when the switch unit is set to the ON state, the gain calculating unit smoothly changes the gain to suppress noise resulting from switching.

4. The acoustic apparatus according to claim 1, comprising:
    a display unit that visualizes the gain calculated by the gain calculating unit.

5. The acoustic apparatus according to claim 1, wherein the gain calculating unit calculates the gain, $C_n$, according the equation:

$$C_n = \{A + \alpha(C_{n-1} - A)\} \times B.$$

6. An automatic gain variable method, comprising:
    a first gain setting step of setting a gain, A, in response to an averaged signal strength of an audio input signal within a predetermined time period;
    a first signal amplifying step of adjusting a signal strength of the audio input signal based upon the gain A set by the first gain setting step;
    a second gain setting step of setting a gain, B, in response to an instantaneous signal strength of an audio output signal of the first signal amplifying step;
    a gain calculating step of calculating a gain, $C_n$, as a product of gain A and gain B adjusted by a smoothing factor including $\alpha C_{n-1}$ B, wherein $\alpha$ is selected to be a time constant smaller than or equal to 1 so that the gain $C_n$ is smoothly changed; and
    a second signal amplifying step of adjusting the signal strength of the audio input signal based upon the gain $C_n$ calculated by the gain calculating step.

7. The automatic gain variable method according to claim 6, wherein the gain calculating step is performed according the equation:

$$C_n = \{A + \alpha(C_{n-1} - A)\} \times B.$$

* * * * *